(12) United States Patent
Lai

(10) Patent No.: US 6,883,591 B2
(45) Date of Patent: Apr. 26, 2005

(54) STACKABLE HEAT SINK

(75) Inventor: Chun-Hung Lai, Sinjhuang (TW)

(73) Assignee: Chi Yuan Co., Ltd., Taipei (TW)

( * ) Notice: Subject to any disclaimer, the term of this patent is extended or adjusted under 35 U.S.C. 154(b) by 0 days.

(21) Appl. No.: 10/660,596

(22) Filed: Sep. 12, 2003

(65) Prior Publication Data
US 2005/0056398 A1 Mar. 17, 2005

(51) Int. Cl.$^7$ .............................................. H05K 7/20
(52) U.S. Cl. ....................... 165/78; 165/80.3; 165/185; 174/16.3; 257/722; 161/704
(58) Field of Search ...................... 165/78, 80.3, 185; 174/16.3; 257/722; 361/704

(56) References Cited

U.S. PATENT DOCUMENTS

| | | | | |
|---|---|---|---|---|
| 2,419,233 A | * | 4/1947 | Spender ..................... | 165/182 |
| 2,434,676 A | * | 1/1948 | Spender ..................... | 165/80.3 |
| 6,340,056 B1 | * | 1/2002 | Huang et al. ............... | 165/185 |
| 6,449,160 B1 | * | 9/2002 | Tsai ........................... | 165/80.3 |
| 6,607,023 B2 | * | 8/2003 | Ho et al. ..................... | 165/78 |
| 6,607,028 B1 | * | 8/2003 | Wang et al. ................ | 165/185 |
| 6,672,379 B1 | * | 1/2004 | Lin et al. .................... | 165/185 |
| 6,789,609 B2 | * | 9/2004 | Tsai et al. ................... | 165/78 |

* cited by examiner

Primary Examiner—Leonard R. Leo
(74) Attorney, Agent, or Firm—Troxell Law Office PLLC

(57) ABSTRACT

A stackable heat sink comprising a plurality numbers of metal heat dissipation plates, the heat dissipation plate further comprises a bottom plate, two side plates facing each other locates on both sides of the bottom plate, a bending area is bent from the top of the side plate, two standing plates stretches up from the bending area and facing another standing plate, two fastening plates each is formed on the proper location on the standing plate, the fastening plate is bendable and forms a bending line with the standing plate; two fastening crevices each is located on the junction of the bottom plate and the side plate. When two of the heat dissipation plates stack together, the standing plate of the bottom heat dissipation plate inserts into the fastening crevice of the top heat dissipation plate to make the lower portion of the bending line of the fastening plate fastened on the bottom plate of the top heat dissipation plate, the two heat dissipation plates are fastened closely, a distance is formed between two heat dissipation plates is formed by side plates for heat dissipation.

3 Claims, 6 Drawing Sheets

STACKABLE HEAT SINK

BACKGROUND OF THE INVENTION

I. Field of the Invention

This invention relates generally to a heat sink and, more specifically, to a stackable heat sink that each heat dissipation plate can fastens and stacks with other heat dissipation plates with certain distance to form heat dissipation gaps, the present invention differs from other heat sinks need plugging boards to be insert into each heat dissipation plate. The top of the heat sink combination is fastener to stable the whole structure; the scheme can lower manufacturing cost, offer higher manufacturing capability and ease of manufacturing.

II. Description of the Prior Art

Heretofore, it is known that most of the heat sinks are made of aluminum by extrusion molding or stamping to have a plurality number of fins in proper distance, the heat is dissipated from the fins with large area to lower the temperature, the one-body structure has a definite shape and specification can be used in certain area, the fins of the heat sink only has limited quantity, the heat dissipation effect is also limited. Now, a combinational heat sinks are available, the structure consists of many stackable heat dissipation plates, by increasing the numbers of heat dissipation plates to increase the heat dissipation area; however the stacking method is to have those heat dissipation plates sit side by side without sufficient heat dissipation space, the heat dissipation effect is not so good as expected.

Some of the combinational heat sinks besides heat dissipation plates, they also provide a base for assembly: many plugging slots with straight plugging boards, through slots are on the heat dissipation plates for the plugging boards, the plugging boards stabilize the heat dissipation plates, a fastener is pressed on top of the heat dissipation plates, the combination of the plugging boards and the fastener fasten and stabilize the whole structure; however such scheme takes too many components and causes the assembly very complex, all the components need extra tooling to manufacture, the whole manufacturing cost is very high. The height of the heat sink structure is limited by the definite height of the plugging board without too much variation.

The "Linkage Mechanism of Heat Sink", Taiwan pattern No. 516794, is to have all the heat dissipation plates in a fastener format and form into a heat sink, as shown in FIG. 1, the folding plate (A1) of the heat dissipation plate forms a through hole (A2) that penetrate through the folding plate (A1), a side plate (A3) extends out from the folding plate (A1), the side plate (A3) with the size is the same as the through hole (A2) and is on the other side corresponding to the heat dissipation plate, a bendable fastener plate (A4) is formed in the side plate (A3). During assembly, the bendable fastener plate (A4) is the stable mechanism of the adjacent heat dissipation plates in horizontal direction for the through hole (A2) is on the folding plate (A1). However if the heat dissipation plates suffer a external pulling stress, the bendable fastener plate (A4) might bend and depart from the through hole (A2), such structure is not strong enough.

SUMMARY OF THE INVENTION

It is therefore a primary object of the invention to provide a stackable heat sink for lower manufacturing cost, offer higher manufacturing capability and ease of manufacturing.

It is still an objective of this invention to provide a stackable heat sink in which the structure is made by stamping in one-body.

In order to achieve the objective set forth, a stackable heat sink in accordance with the present invention comprises a plurality numbers of heat dissipation plates, the heat dissipation plate further comprises a bottom plate, two side plates facing each other locates on both sides of the bottom plate, a bending area is bent from the top of the side plate, two standing plates stretches up from the bending area and facing another standing plate, two fastening plates each is formed on the proper location on the standing plate, the fastening plate is bendable and forms a bending line with the standing plate; two fastening crevices each is located on the junction of the bottom plate and the side plate. When two of the heat dissipation plates stack together, the standing plate of the bottom heat dissipation plate inserts into the fastening crevice of the top heat dissipation plate to make the lower portion of the bending line of the fastening plate fastened on the bottom plate of the top heat dissipation plate, the two heat dissipation plates are fastened closely, a distance is formed for heat dissipation.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DESCRIPTION OF THE PREFERRED EMBODIMENT

Figure 1:
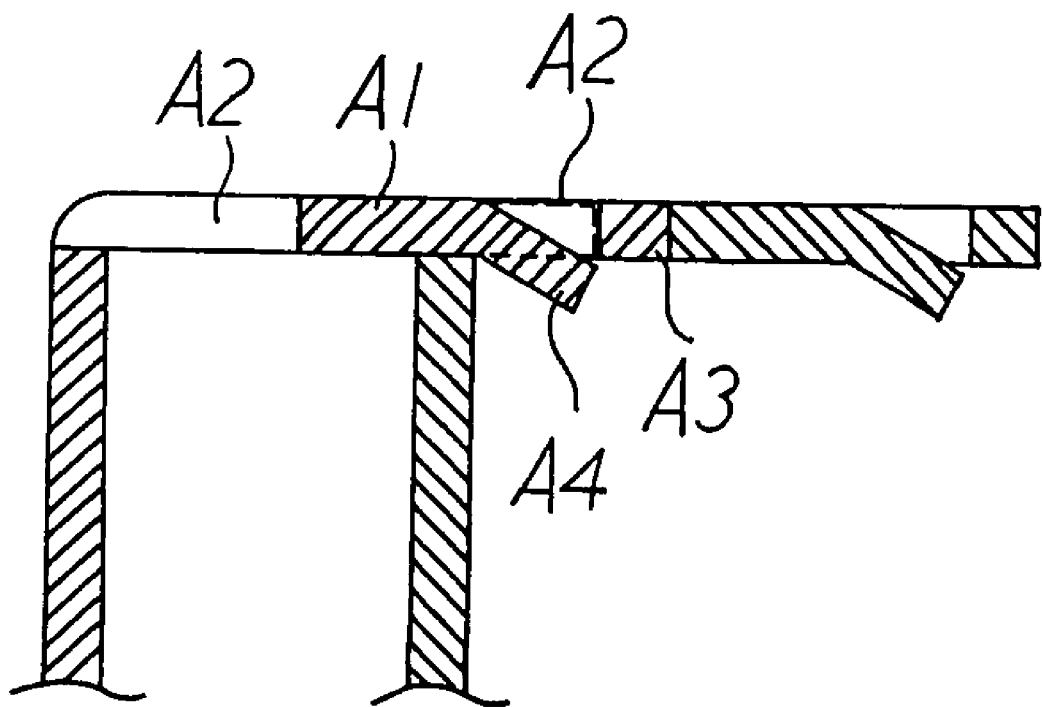
FIG. 1 is a cross-sectional view of the linkage of the prior art.
Figure 2:
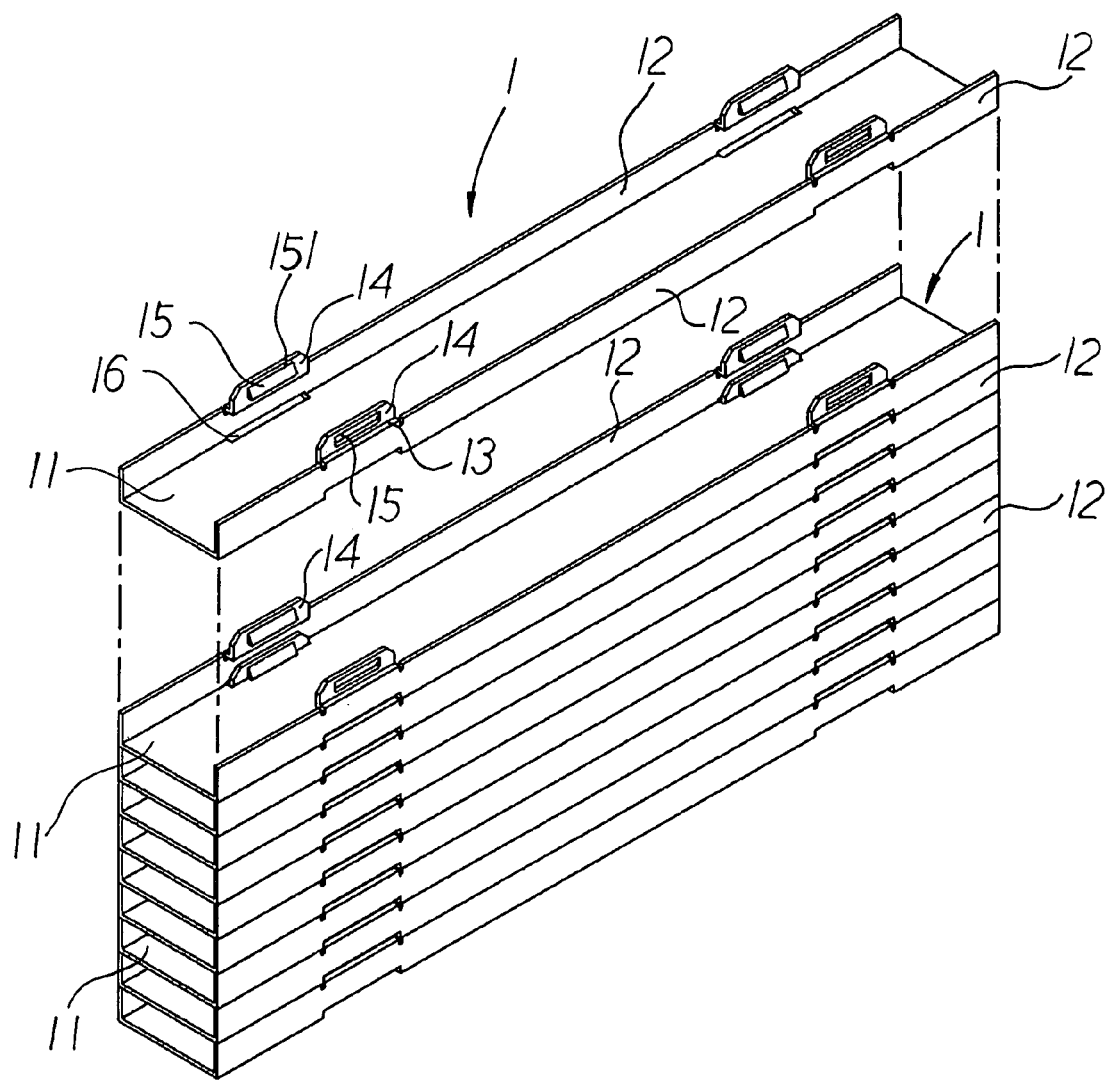
FIG. 2 is a structure view of the present invention.
Figure 3:
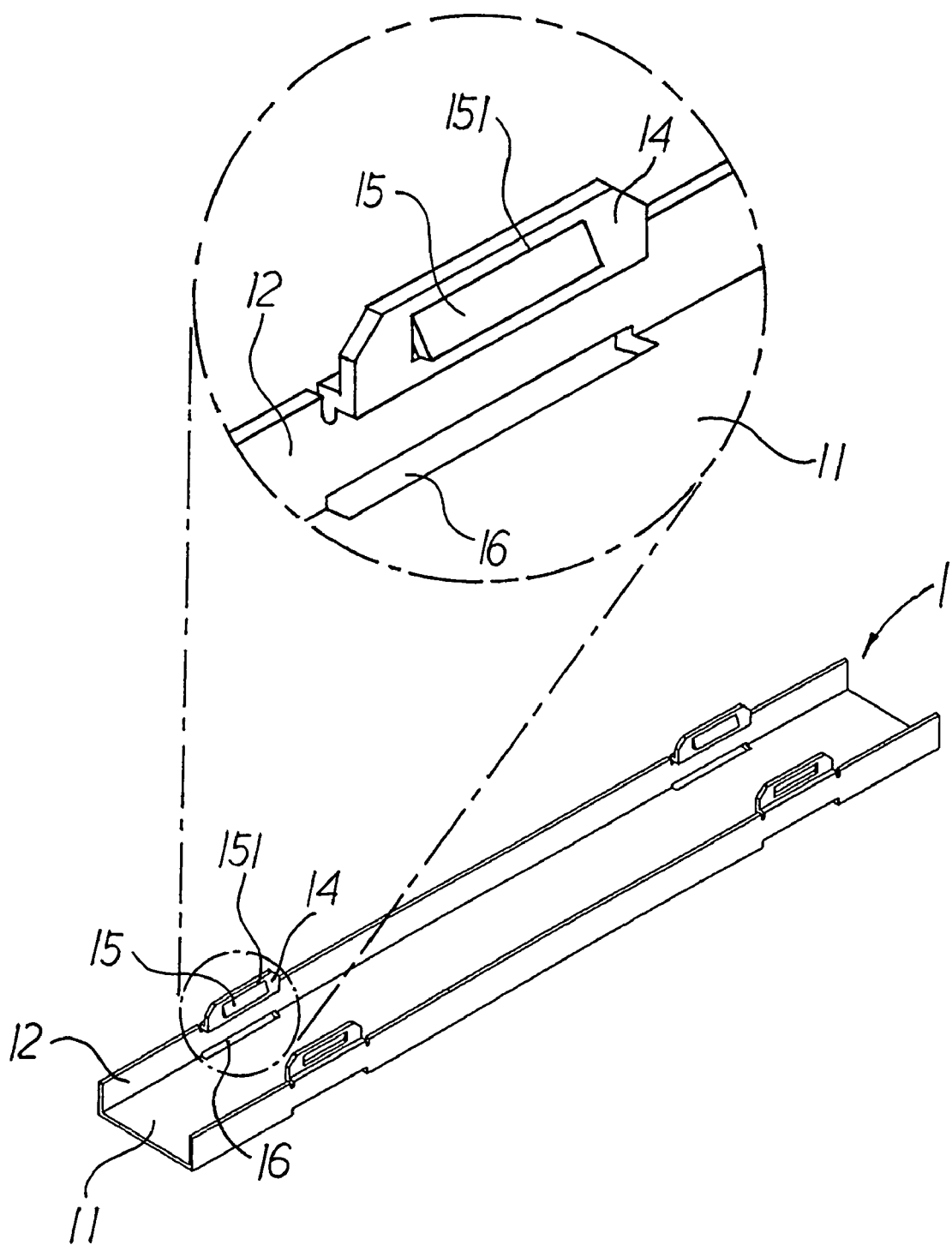
FIG. 3 is a cross-sectional of the present invention.

Referring to FIG. 2 and FIG. 3, the present invention is composed of many stackable heat dissipation plate (1), the heat dissipation plate (1) further composes of a bottom plate (11), two side plate (12) facing each other are on both sides of the bottom plate (11), referring g to FIG. 2, the heat dissipation plate (1) is made from stamping. The side plate (12) bends inward and forms a bending area (13); a standing plate (14) stretches up from the bending area (13) and faces another standing plate (14). A fastening plate (15) is formed on the proper location on the standing plate (14), the fastening plate (15) is a bendable plate; a bending line (151) is on the junction of the standing plate (14) and the fastening plate (15), the bending line (151) stretches vertically to the standing plate (14) to make the fastening plate (15) bendable to the center of the heat dissipation plate (1). A fastening crevice (16) is on the junction of the bottom plate (11), the side plate (12) and corresponding to the bending area (13), the standing plate (14).

Figure 4:
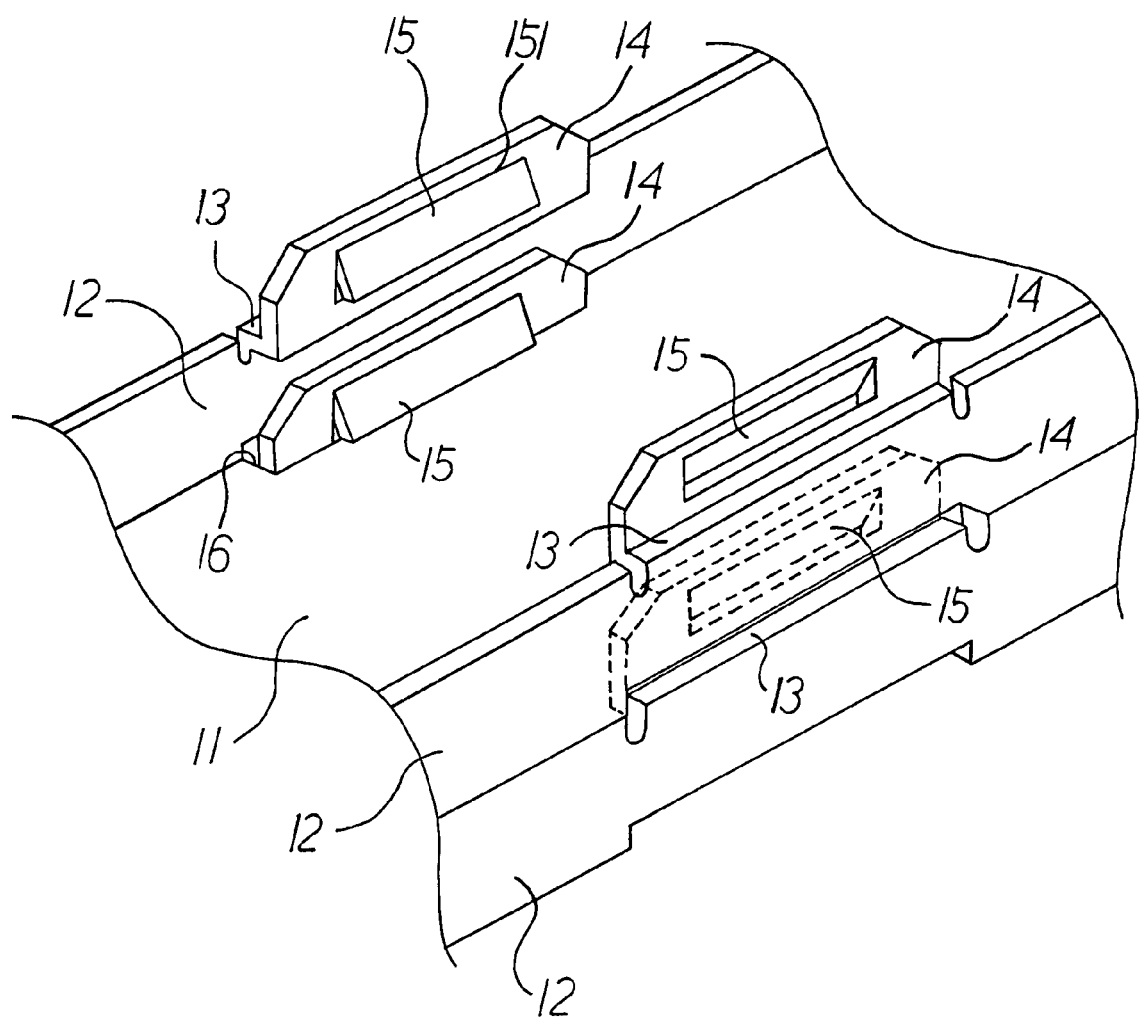
FIG. 4 is an assembly view of the present invention.
Figure 5:
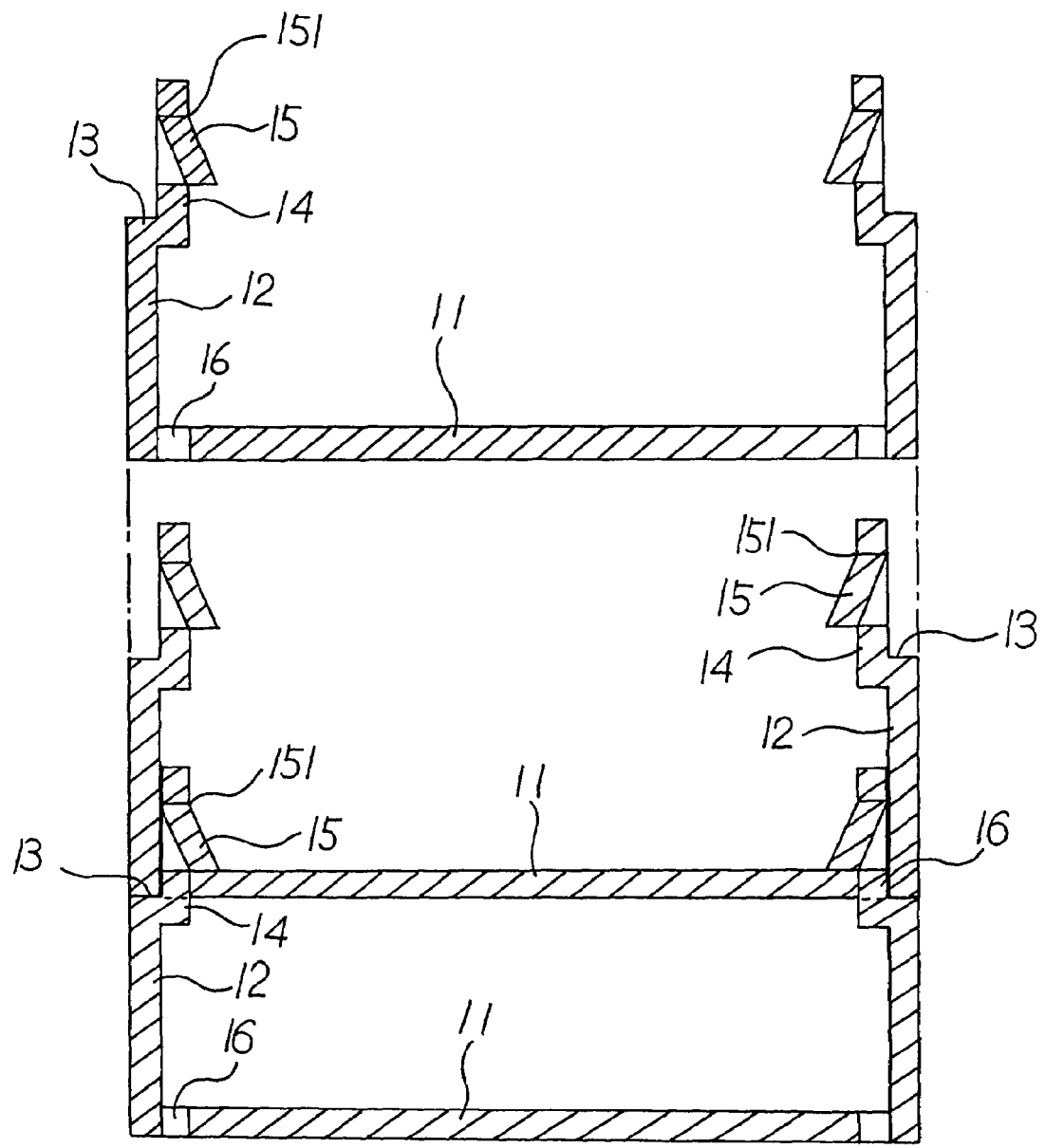
FIG. 5 is an application view the present invention.
Figure 6:
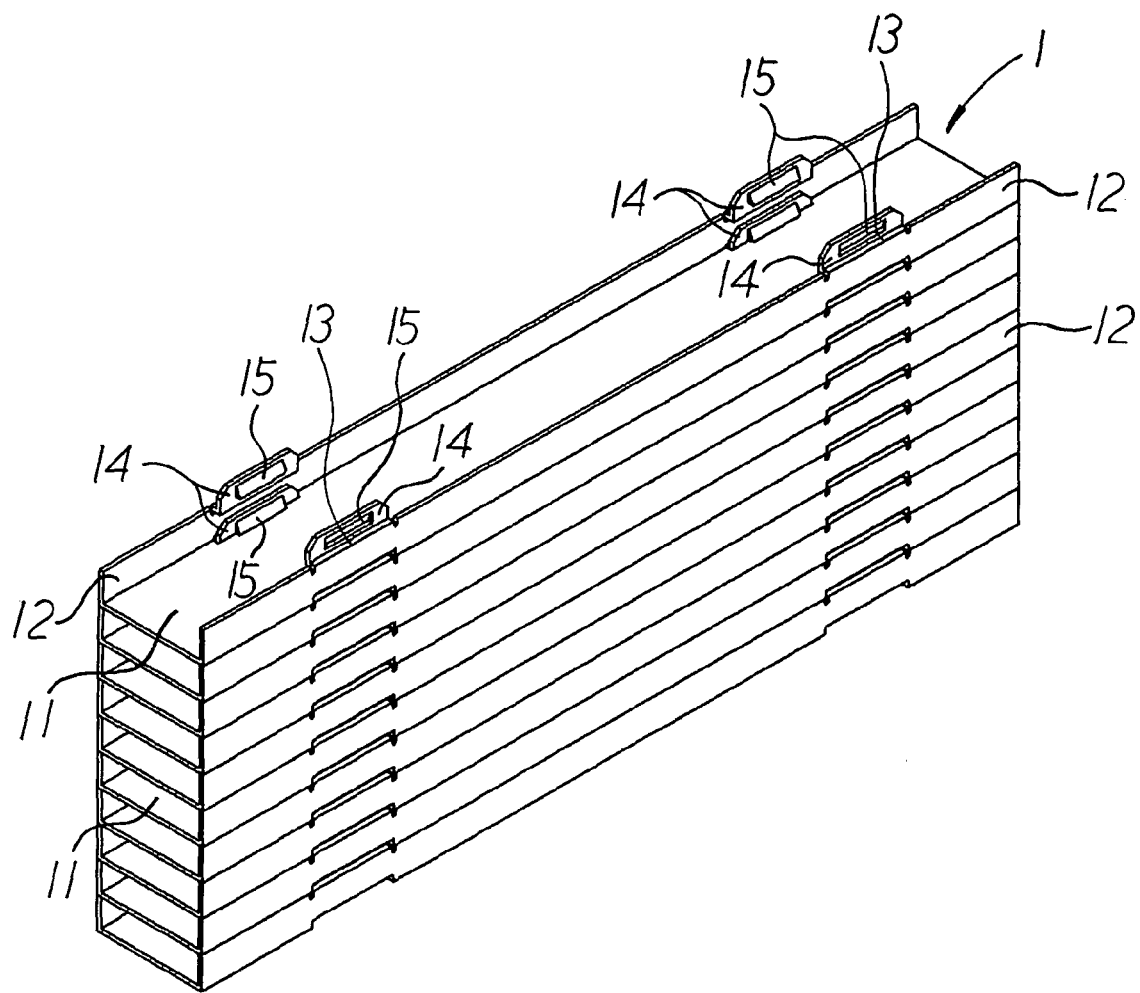
FIG. 6 is a perspective view the present invention.

Referring to FIG. 3 and FIG. 4, when two heat dissipation plate (1) stack together, the standing plate (14) of the bottom heat dissipation plate (1) inserts into the fastening crevice (16) of the top heat dissipation plate (1) to make lower portion of the bending line (151) of the fastening plate (15) fasten on the bottom plate (11) of the top heat dissipation plate (1), the fastening plate (15) will not loose easily to make the top and the bottom heat dissipation plate (1) tight together closely as shown in FIG. 5.

When all the heat dissipation plate (1) fasten together, the bottom of all the heat dissipation plate (1) form a larger heat dissipation area; with the separation of the side plate (12), the overall heat sink can have good heat dissipation gap to make each of the bottom plate (11) of the heat dissipation plate (1) dissipates heat effectively for the best heat dissipation effect. The present invention applies the fastening of each heat dissipation plate (1) closely that is different from the plugging board among heat dissipation plates of the prior art, the manufacturing cost is lower, and the assembly method is simpler.

While a preferred embodiment of the invention has been shown and described in detail, it will be readily understood and appreciated that numerous omissions, changes and additions may be made without departing from the spirit and scope of the invention.

What is claimed is:

1. A stackable heat sink comprising:

a heat dissipation plate having a bottom plate;

two side plates facing each other located on both sides of said bottom plate, a bending area being bent from the top of each said side plate;

two standing plates, each stretching up from said bending area and facing another said standing plate;

two fastening plates, each formed on a respective said standing plate, said fastening plate is bendable and forms a bending line with said standing plate;

two fastening crevices, each located on the junction of said bottom plate and said side plate, when two said heat dissipation plates stack together, said standing plate of one heat dissipation plate inserts into said fastening crevice of an adjacent heat dissipation plate to make a lower portion of said bending line of said fastening plate fastened on said bottom plate of said adjacent heat dissipation plate.

2. The stackable heat sink recited in claim 1, wherein said heat dissipation plate is formed by stamping, said standing plate and said fastening plate being made at the same time, the whole structure being one-body.

3. The stackable heat sink recited in claim 1, wherein said fastening plate being bendable toward the center of said heat dissipation plate.

* * * * *